(12) United States Patent (10) Patent No.: US 8,154,432 B2
Kaper et al. (45) Date of Patent: Apr. 10, 2012

(54) DIGITAL TO ANALOG CONVERTER (DAC) HAVING HIGH DYNAMIC RANGE

(75) Inventors: Valery S. Kaper, Winchester, MA (US); John P. Bettencourt, Danvers, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 12/728,749

(22) Filed: Mar. 22, 2010

(65) Prior Publication Data

US 2011/0227770 A1   Sep. 22, 2011

(51) Int. Cl.
*H03M 1/10* (2006.01)
(52) U.S. Cl. .................... 341/120; 330/149; 370/342
(58) Field of Classification Search .......... 341/144–170; 330/149, 52; 375/297, 261, 296, 149, 295, 375/285; 455/91, 114.3
See application file for complete search history.

(56) References Cited

U.S. PATENT DOCUMENTS

| | | | | |
|---|---|---|---|---|
| 4,541,065 | A * | 9/1985 | Faulkner et al. | 702/87 |
| 6,566,873 | B1 * | 5/2003 | Smith et al. | 324/300 |
| 6,703,956 | B1 | 3/2004 | Mueller et al. | |
| 6,907,025 | B2 * | 6/2005 | Demir et al. | 370/342 |
| 7,109,705 | B2 * | 9/2006 | Smith et al. | 324/300 |
| 7,145,962 | B2 * | 12/2006 | Lee | 375/296 |
| 7,289,773 | B2 * | 10/2007 | Braithwaite | 455/91 |
| 7,333,561 | B2 * | 2/2008 | Pinckley et al. | 375/297 |
| 7,340,223 | B1 * | 3/2008 | Wright et al. | 455/91 |
| 7,504,976 | B1 | 3/2009 | Pellon | |
| 7,561,636 | B2 * | 7/2009 | Song et al. | 375/297 |
| 7,592,939 | B1 | 9/2009 | Cruz-Albrecht et al. | |
| 2005/0009479 | A1 * | 1/2005 | Braithwaite | 455/114.3 |
| 2005/0124303 | A1 | 6/2005 | Bengtson et al. | |
| 2005/0253652 | A1 * | 11/2005 | Song et al. | 330/149 |
| 2005/0255814 | A1 | 11/2005 | Song et al. | |
| 2008/0290938 | A1 | 11/2008 | Gupta et al. | |

FOREIGN PATENT DOCUMENTS

| | | |
|---|---|---|
| EP | 2 026 487 A1 | 2/2009 |
| EP | 2 154 852 A2 | 2/2010 |

OTHER PUBLICATIONS

D. Wouter, J. Groeneveld, Hans J. Schouwenaars, Henk A.H. Termeer, Cornelious A. A. Bastiaansen, A Self-Calibration Technique for Monolithic High-Resolution D/A Converters, Feb. 4, 2009 IEEE, pp. 1517-1522.

J. Jacob Wikner, Mark Vesterbacka, Characteristics of Linear-Coded D/A Converters, 2000 IEEE, pp. 67-72.

(Continued)

*Primary Examiner* — Lam T Mai
(74) *Attorney, Agent, or Firm* — Daly, Crowley, Mofford & Durkee, LLP

(57) ABSTRACT

A system having: a digital pre-distortion circuit fed by a digital signal for distorting the digital signal; a digital to analog converter (DAC) core section coupled to an output of the calibration circuit for converting the distorted digital signal into a corresponding analog signal, the DAC core section performing the conversion in accordance with a control signal fed to the DAC core section; a power amplifier (PA) section coupled to an output of the DAC core section for amplifying power in the analog signal; and a calibration circuit coupled to the output of the power amplifier for producing, in response to the power in the power amplified analog signal, the control signal for the DAC core section.

19 Claims, 7 Drawing Sheets

OTHER PUBLICATIONS

Myung-Jun Choe, Kwang-Hyun Baek, Mesfin Teshome, A 1.6-GS/s 12-bit Return-to-Zero GaAs RF DAC for Multiple Nyquist Operation, IEEE, vol. 40, No. 12, Dec. 2005, pp. 2456-2468.
Paul Hendricks, The Practical Engineer, IEEE, Jul. 1997, pp. 58-69.
Notification of Transmittal of the International Search Report and the Written Opinion of the International Searching Authority, or the Declaration dated Aug. 4, 2011, PCT/US2011/027339.
Written Opinion of the International Searching Authority dated Aug. 4, 2011, PCT/US2011/027339.

* cited by examiner

DIGITAL TO ANALOG CONVERTER (DAC) HAVING HIGH DYNAMIC RANGE

TECHNICAL FIELD

This disclosure relates generally to digital to analog converters (DACs) and more particularly to high power DACs.

BACKGROUND

As is known in the art, historically, the focus in the design of digital-to-analog converters (DACs) has been on simultaneously achieving the highest possible bandwidth and dynamic range. Obtaining high output power has been limited due to the use of relatively low-voltage based, technologies (Si and SiGe bipolar, Si CMOS, InP HBT) and the architectures that emphasized the bandwidth and dynamic range. Additionally, a high-quality DAC output signal could be amplified by an amplifier to reach the required output power levels. However, use of an amplifier at the DAC output comes at the cost of dynamic range—efficiency trade-off. To preserve the dynamic range, an amplifier must be operated in a linear range with relatively low efficiency, resulting in the high prime power consumption and, often, thermal management complications. Using amplifier in the nonlinear regime with higher efficiency and alleviated thermal issues compromises amplifier linearity and, as a result, the dynamic range of the output signal.

In a traditional digital-analog converter (DAC) design, the emphasis is placed on simultaneously maximizing bandwidth and dynamic range while minimizing power consumption with the output power being only a $2^{nd}$ order requirement, As a result, state-of art DACs (and direct digital synthesizers (DDSs)) exhibit relatively low output power levels (<0 dBm).

For systems that require higher output power levels (for example, Active Electronically Scanned Arrays (AESAs)) with element-level digital beamforming architecture), the DAC output needs to be amplified by either: Linear amplifiers to preserve the dynamic range at the expense of efficiency; or Non-linear amplifiers to maximize efficiency at the expense of dynamic range Therefore, there is a need for a DAC having a power-efficiency with both high bandwidth, high dynamic range and high output power.

SUMMARY

In accordance with the present disclosure, a system is provided having: a digital pre-distortion circuit fed by a digital signal for distorting the digital signal; a digital to analog converter (DAC) core section coupled to an output of the pre-distortion circuit for converting the distorted digital signal into a corresponding analog signal, the DAC core section performing the conversion in accordance with a control signal fed to the DAC core section; a power amplifier (PA) section coupled to an output of the DAC core section for amplifying power in the analog signal; and a calibration circuit coupled to the output of the power amplifier for producing, in response to the power in the power amplified analog signal, the control signal for the DAC core section.

With such an arrangement, the input digital signal is first pre-distorted to compensate for known (previously characterized) nonlinearities of the following DAC core section and PA section. This predistorted digital signal is then provided to the input of the DAC core section that converts it into a pre-distorted low-power analog waveform of the required bandwidth.

This pre-distorted low-power analog waveform is then applied to the input of a high-efficiency power amplifier (PA) section that amplifies the signal and produces a high-power analog waveform with a certain level of the dynamic range. This level of the dynamic range is achieved by taking into account linearity limitations of both the DAC core section and the power amplifier and intentionally corrupting (or pre-distorting) the input digital signal with the use of the pre-distortion circuit.

In one embodiment, a feedback calibration circuit is provided for sensing the waveform at the PA section output and for comparing the sensed waveform with a pre-stored reference waveform to generate a digital error correction signal. This digital error correction signal is then provided to an input to the DAC core section for adjusting bias settings in individual converter bits of the DAC core section to further compensate for the PA section nonlinearity by modifying the core DAC core section waveform.

In one embodiment, the digital pre-distortion circuit at the input of DAC core section/PA section combination is arranged to correct for pre-determined nonlinearities of both the DAC core section and the PA section.

In one embodiment, the calibration circuit provides a feedback circuit for sensing the waveform at the PA section output and compares the sensed waveform against a pre-stored reference waveform to generate a digital error correction signal for adjusting the power amplifier (e.g., bias, reconfigurable matching networks).

In one embodiment, the calibration circuit provides a feedback circuit for sensing the waveform at the PA section output and compares the sensed waveform against a pre-stored reference waveform to generate a digital error correction signal for adjusting the pre-distortion circuit With such an arrangement, the use of digital pre-distortion in combination with the feedback calibration responsive to the amplifier output power adjusts the settings of the low-power high dynamic range DAC core section and/or power amplifier (e.g., bias, reconfigurable matching networks) and/or digital pre-distortion circuit with the purpose of maximizing dynamic range of an output high-power RF signal (i.e., the output of the power amplifier (PA) section).

In one embodiment, the PA section includes a plurality of adjustable power amplifiers (PAs) at the output of the DAC core section.

In one embodiment, each DAC bit in the DAC core section is followed by a corresponding one of the plurality of adjustable power amplifiers (PAs). A high power high dynamic range RF signal is then constructed by combining the outputs all of the plurality of (PAs). Such an arrangement provides for an added flexibility of independent control of the amplified signals of individual DAC bits in constructing analog signal at the system's output with a required dynamic range level.

In another embodiment, the outputs of DAC Least Significant Bits (LSB bits) are first combined with an R-2R ladder network within the DAC core section and then amplified by the corresponding coupled one of a first portion of the plurality of power amplifiers (PAs), while the outputs of DAC Most Significant Bits (MSB bits) are first "linearly coded", for example, "thermometer coded", and then amplified by a corresponding coupled one of a second portion of the plurality of power amplifiers (PAs). A high power high dynamic range RF signal is then constructed by combining the outputs of the first portion and the second portion of the plurality of power amplifiers (PAs).

In one embodiment, the outputs of all (or some) of the plurality of power amplifiers are sensed, collected and analyzed, and the control signals are generated by the feedback calibration circuit. These control signals are then applied to adjust the settings of the low-power high dynamic range DAC core section and/or power amplifier section (e.g., bias, reconfigurable matching networks) and/or digital pre-distortion circuit with the purpose of maximizing dynamic range of an output high-power RF signal In one-embodiment, all or parts of the configuration are heterogeneously integrated on a single chip with each of the components implemented in the most applicable semiconductor technology. For example, The DAC core section in silicon and the PAs in III-V.

In one embodiment, the digital pre-distortion circuit, DAC core section, LSB power amplifiers and the calibration circuit are implemented in low-power high-speed CMOS while MSB power amplifiers are implemented in a high-frequency high-power high-linearity III-V technology (for example, GaN HEMT or InP HBT or GaAs HBT or GaAs pHEMT).

In another embodiment, to maximize bandwidth and static dynamic range, the DAC core section is implemented in a bipolar technology with the highest switching speed (InP HBT). An enhancement in bandwidth, output power and dynamic range is realized by reducing the interconnect dimensions by virtue of having all or some parts of the configuration on a single chip.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

Like reference symbols in the various drawings indicate like elements.

DETAILED DESCRIPTION

Figure 1A:
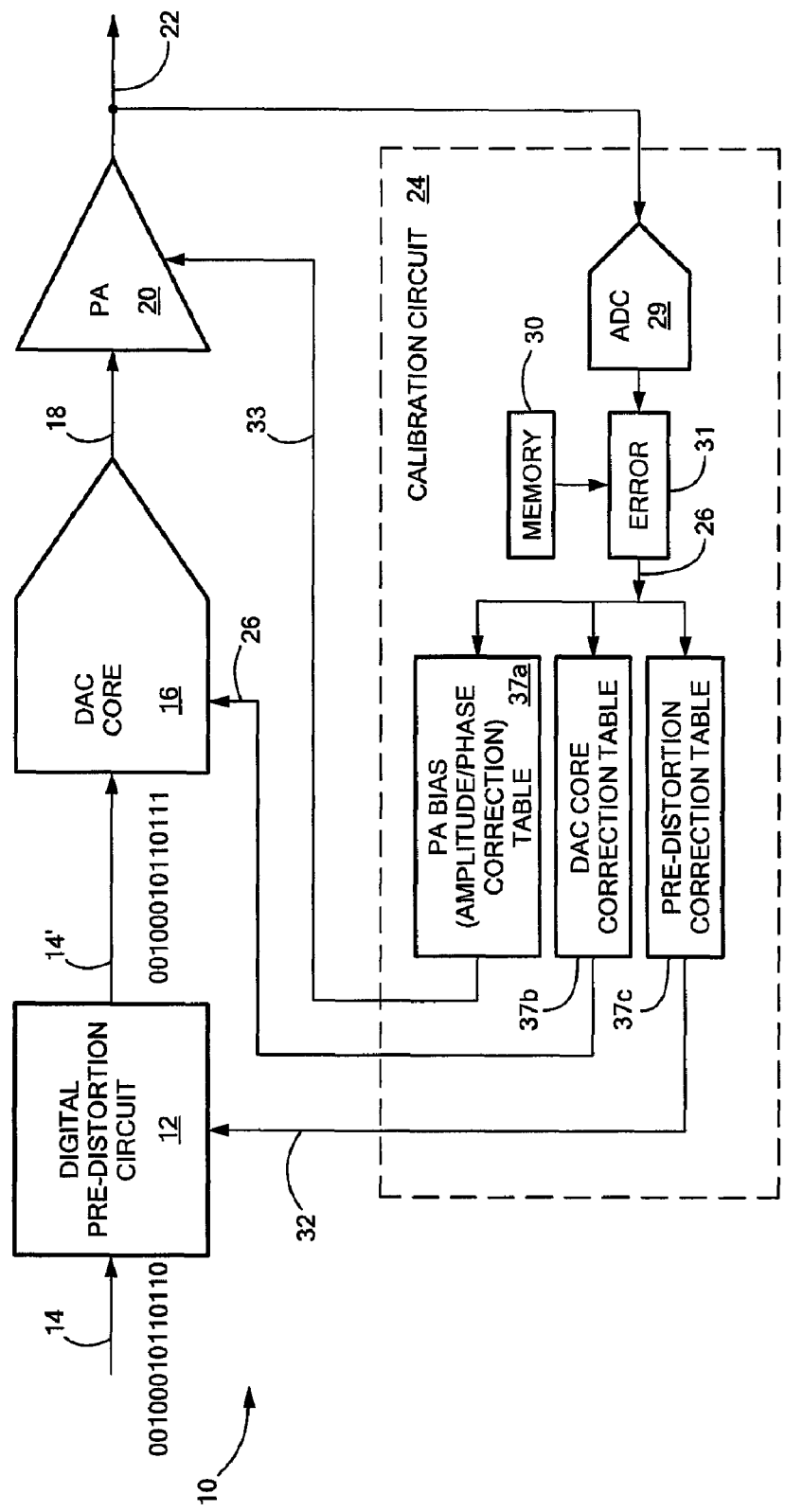
FIG. 1A is a block diagram of a digital to analog converter system according to the disclosure.

Referring now to FIG. 1A, an analog to digital (DAC) system 10 is shown having a digital pre-distortion circuit 12 fed by a digital signal 14. The digital pre-distortion circuit 12 distorts the digital signal 12 in a manner to be described, by here changing a bit or bits of the digital signal 12, Thus, for example, if the bits of the digital signal are 0010001101110, as indicated in FIG. 1A, the digital pre-distortion circuit 12 may produce an output digital signal 14' of changing a bit or bits of the digital signal 14. Thus, for example, if the bits of the digital signal are 0010001101110, where the least significant bit of the digital signal 14 has been changed.

The DAC system 10 includes a digital to analog converter (DAC) core section 16 which converts the distorted digital signal 14' into corresponding analog signal 18. Here, for example, the DAC core section 16 is an R-2R type DAC. As will be described in more detail below, the DAC core section 16 performs the digital to analog conversion in accordance with a control signal 26 fed to the DAC core section 16. The analog signal 18 is fed to the input of a power amplifier (PA) section 20, for amplifying power in the analog signal 18 and thereby producing the output 22 for the DAC system 10.

The DAC system 10 includes a calibration circuit 24 coupled to the output of the power amplifier 20 for producing, in response to the power amplified analog signal at output 22, the control signal 26 for the DAC core section 16, a control signal on line 32 for the pre-distortion circuit 12 and a control signal on line 33 for the power amplifier section 20, in a manner to be described.

The input digital signal 14 is first pre-distorted by the digital pre-distortion circuit 12 to compensate for known (previously characterized) nonlinearities of the following DAC core section 16 and PA section 20. The predistorted digital signal 14; is then provided to the input of the DAC core section 16 that converts it into a pre-distorted low-power analog waveform signal 18 of the required bandwidth. This pre-distorted low-power analog waveform signal 18 is then applied to the input of a high-efficiency power amplifier (PA) section 20 that amplifies the signal 18 and produces a high-power analog waveform output 22 with a certain level of the dynamic range. This level of the dynamic range is achieved by taking into account linearity limitations of both the DAC core section 16 and the power amplifier section 20 and intentionally corrupting (or pre-distorting) the input digital signal 14 with the use of the pre-distortion circuit 12 to produce digital signal 14'.

The feedback calibration circuit 24 is provided for sensing the waveform at the PA section output 22, converting such signal into a corresponding digital signal in analog to digital converter (ADC) 29, and for comparing the sensed waveform signal 12 with a pre-stored reference waveform stored in a memory 30 in an error generating circuit 31 within the calibration circuit 24 to generate a digital error correction signal, i.e., signal 26. This digital error correction signal 26 is, as noted above, then provided to an input to the DAC core section 26 for adjusting bias settings in individual converter bits of the DAC core section 16 via the signal on line 26, a bias signal to the power amplifier section 320 to adjust the gain and phase response of the power amplifier section 20 via line 33, and to control the pre-distortion in the pre-distortion circuit 12 via line 32, and hereby compensate for the PA section 20 nonlinearity and dynamic range. Here, in this embodiment, the digital pre-distortion circuit 12 at the input of core DAC core section 16/PA section 20 combination is arranged to correct for pre-determined nonlinearities of both the DAC core section 16 and the PA section. 20. The calibration circuit 24 provides a feedback circuit for sensing the waveform signal 22 at the PA section 20 output and compares the sensed waveform signal 22 against a pre-stored reference waveform, stored in memory 30, to generate a digital error correction signals on lines 26, 32 and 33. With such an arrangement, the use of digital pre-distortion circuit 12 in combination with the feedback calibration circuit 24 responsive to the amplifier output power signal 22 adjusts the settings of the low-power high dynamic range DAC core section 16 and/or power amplifier 16 (e.g., bias, reconfigurable matching networks) and/or digital pre-distortion circuit 12 with the purpose of maximizing dynamic range of an output high-power RF signal 22 (i.e., the output of the power amplifier (PA) section 20).

As shown, the calibration circuit 24 includes a PA bias amplitude and phase correction table 37a, (e.g., a read only memory (ROM), a DAC core correction table 37b, and a pre-distortion table 37c all fed by a digital error signal produced by the error circuit on line 26. The output of the PA bias amplitude and phase correction table 37a produces the control signal for the PA section 20 on line 33, the DAC core correction table 37b produces the control signal for the DAC core 16 on line 28, and the pre-distortion table 37c produces the control signal for the pre-distortion circuit 12 on line 33. The data stored in the PA bias amplitude and phase correction table 37a, the DAC core correction table 37b, and the pre-distortion table 37c is obtained by a calibration procedure. For example, if the bit size of the input digital signal is N, where N is an integer, then there are $2^N$ possible input digital words which may be fed on line 14. (i.e., the amplitude range of the input signals). During the calibration mode, each one of the $2^N$ possible input digital words is fed to line 14 with the output of the PA section decoupled from the input to the calibration circuit 24 and with the memory 30 decoupled from the error circuit 31, a teat equipment, (e.g., not computer), not shown, generates control signals on lines 26, 32 and 33 with the output of the PA section being monitored to determine the optimum combination of control signals on lines 26, 32 and 33. Additionally the calibration test is performed dynamically with a different time sequences of the $2^N$ possible input digital words to determine the optimum combination of control signals on lines 26, 32 and 33. The results of the calibration procedure are used to determine a nominal one of the $2^N$ possible input digital words which has associated with it the correction terms to be stored in the PA bias amplitude and phase correction table 37a, the DAC core correction table 37b, and the pre-distortion table 37c that will result in the system 10 providing maximum gain with minimum distortion and maximum dynamic range.

This nominal one of the $2^N$ possible input digital words is stored in memory 30. The memory 30 is coupled to the error circuit 31. Test equipment, not shown, feeds the $2^N$ possible input digital words to the error circuit 31. As each one of the $2^N$ possible input digital words is fed to the error circuit 31, $2^N$ error words which generates control signals on lines 26, 32 and 33 with the output of the PA section being monitored to determine the optimum combination of control signals on lines 26, 32 and 33. The determined control signals provide the data for the P/A bias amplitude and phase correction table 37a, the DAC core correction table 37b, and the pre-distortion table 37c and are stored in such tables. Thus, each one of the tables 37a, 37b and 37c has stored therein $2^N$ error terms.

Figure 1B:
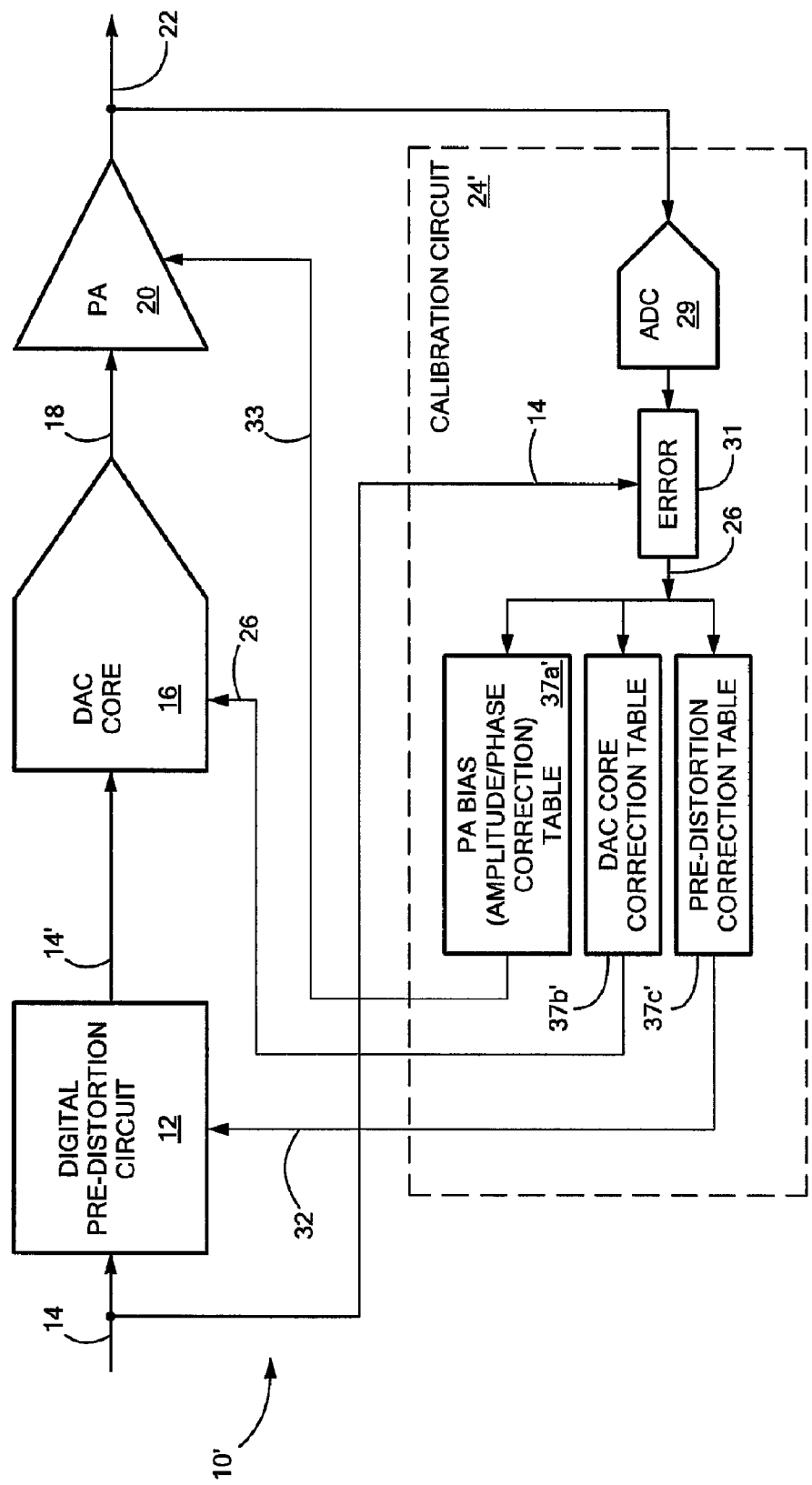
FIG. 1B is a block diagram of a digital to analog converter system according to another embodiment of the disclosure.

During normal operation, the PA section output 22 is coupled to the calibration circuit 24 and the nominal digital word described above, is stored in the memory 31. Thus, the output analog signal on line 29 is converted into a corresponding digital word by ADC 29. This produced digital word is compared with the digital word stored in memory 31. The difference between these digital words is fed to the PA bias amplitude and phase correction table 37a, the DAC core correction table 37b, and the pre-distortion table 37c to generate the proper control signals on lines 32, 26, and 33, respectively Referring to FIG. 1B, here, the system 10' uses dynamic calibration. It is noted that the memory 30 in FIG. 1A has been replaced with the input signal on line 14 being fed to error correction circuit 24'. Again, during the calibration mode, each one of the $2^N$ possible input digital words is fed to line 14 with the output of the PA section 20 decoupled from the input to the calibration circuit 24', and a computer (not shown) generates control signals on lines 26, 32 and 33 with the output of the PA section 20 being monitored to determine the optimum combination of control signals on lines 26, 32 and 33. Additionally the calibration test is performed dynamically with a different time sequences of the $2^N$ possible input digital words to determine the optimum combination of control signals on lines 26, 32 and 33. The results of the calibration procedure is used to generate $2^N$ possible input digital words which has associated with it the correction terms to be stored in the P/A bias amplitude and phase correction table 37a', the DAC core correction table 37b', and the pre-distortion table 37c' that will result in the system 10' providing maximum gain with minimum distortion and maximum dynamic range. The $2^N$ generated correction terms are stored in the PA bias amplitude and phase correction table 37a', the DAC core correction table 37b', and the pre-distortion table 37c'. It is noted that the PA bias amplitude and phase correction table 37a', the DAC core correction table 37b', and the pre-distortion table 37c' may have stored there many more correction terms, one for each possible time sequence between two or more possible digital words being fed to the system 10'.

Figure 2:
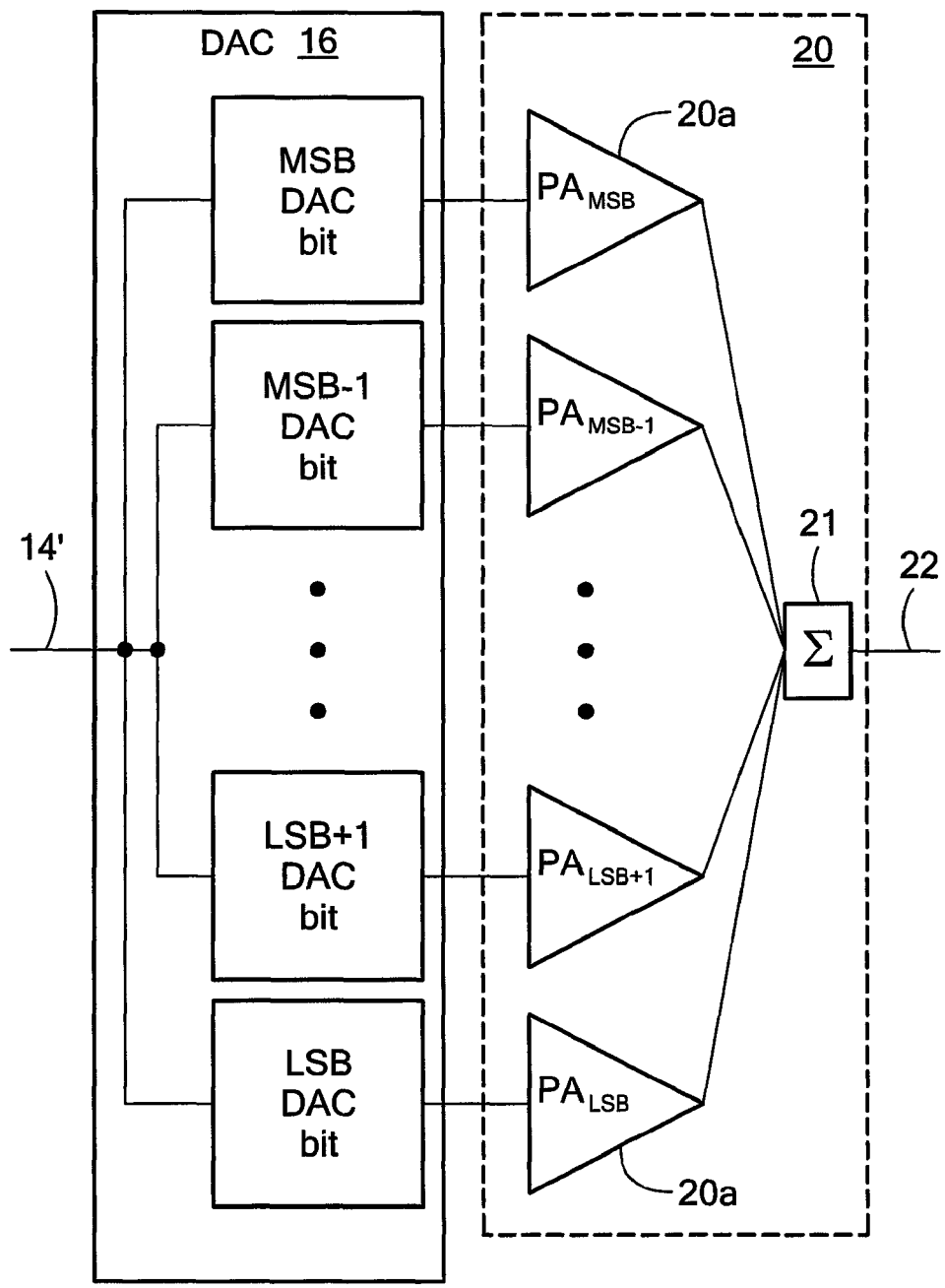
FIG. 2 is a block diagram of a digital to analog core section and a power amplifier section used in the digital analog circuit in accordance with an embodiment of the invention.

Referring now to FIG. 2, in this embodiment, the PA section 20 includes a plurality of power amplifiers (PAs) 20a adjustable in gain and/or phase at the output of the DAC core section 20. Here, each DAC bit in the DAC core section 16 is followed by a corresponding one of the plurality of adjustable power amplifiers (PAs) 20a. A high power high dynamic range RF signal is then constructed by combining the outputs all of the plurality of (PAs) 20 in a summer 21.

Figure 3:
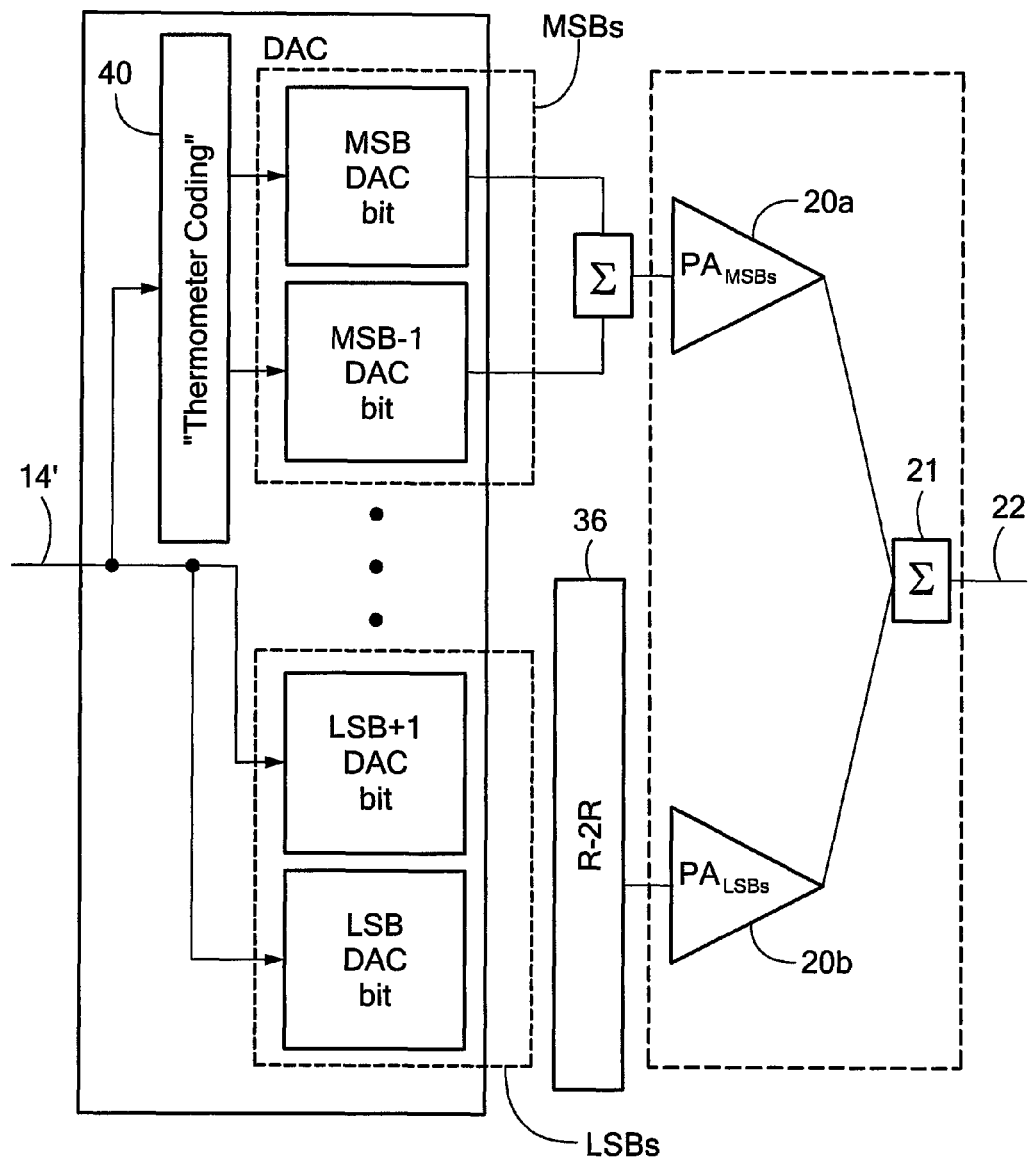
FIG. 3 is a block diagram of a digital to analog core section and a power amplifier section used in the digital analog circuit in accordance with another embodiment of the invention.

Referring now to FIG. 3, in this embodiment, the outputs of DAC Least Significant Bits (LSB bits) are first combined with an R-2R ladder network 36 within the DAC core section 16 and then amplified by the corresponding coupled one of a first portion of the plurality of power amplifiers (PAs) 20b, while the outputs of DAC Most Significant Bits (MSB bits) are first "linearly coded" 40 and then amplified by a corresponding coupled one of a second portion of the plurality of power amplifiers (PAs) 20a. A high power high dynamic range RF signal is then constructed by combining the outputs of the first portion and the second portion of the plurality of power amplifiers (PAs) 20a, 20b in an adder 21.

Figure 4:
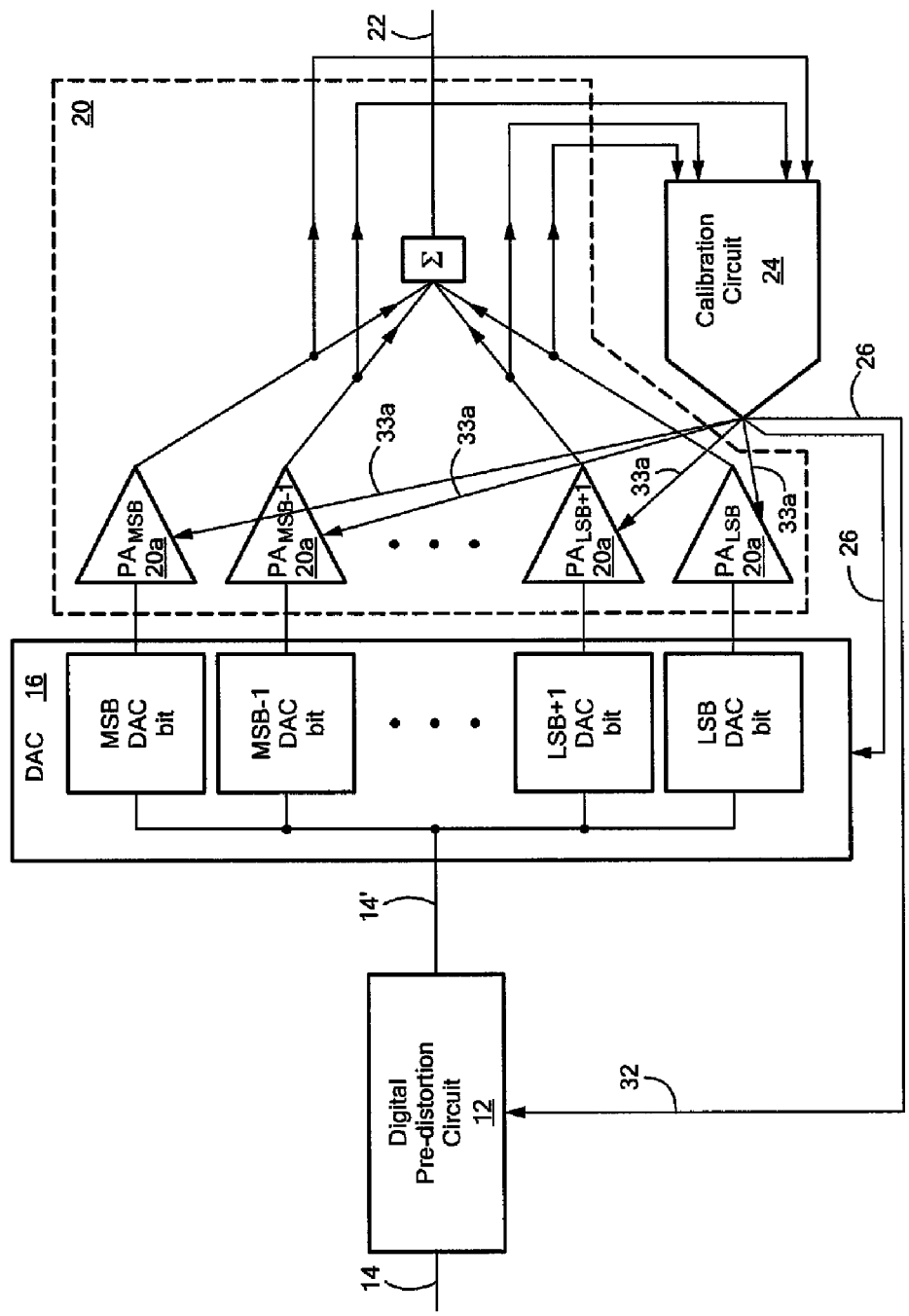
FIG. 4 is a block diagram of a digital to analog core section, a power amplifier section and a calibration circuit used in the digital analog circuit in accordance with another embodiment of the invention.

Referring now to FIG. 4, the outputs of all (or some) of the plurality of power amplifiers 20a of the PA section 20 are sensed, collected and analyzed by the calibration circuit 24, and the control signals 33a are generated by the feedback calibration circuit 24. These control signals 33a are then applied to adjust the settings of the low-power high dynamic range DAC core section 16 and/or power amplifier section 20a (e.g., bias, reconfigurable matching networks) and/or digital pre-distortion circuit 12 with the purpose of maximizing dynamic range of an output high-power RF signal.

Figure 5:
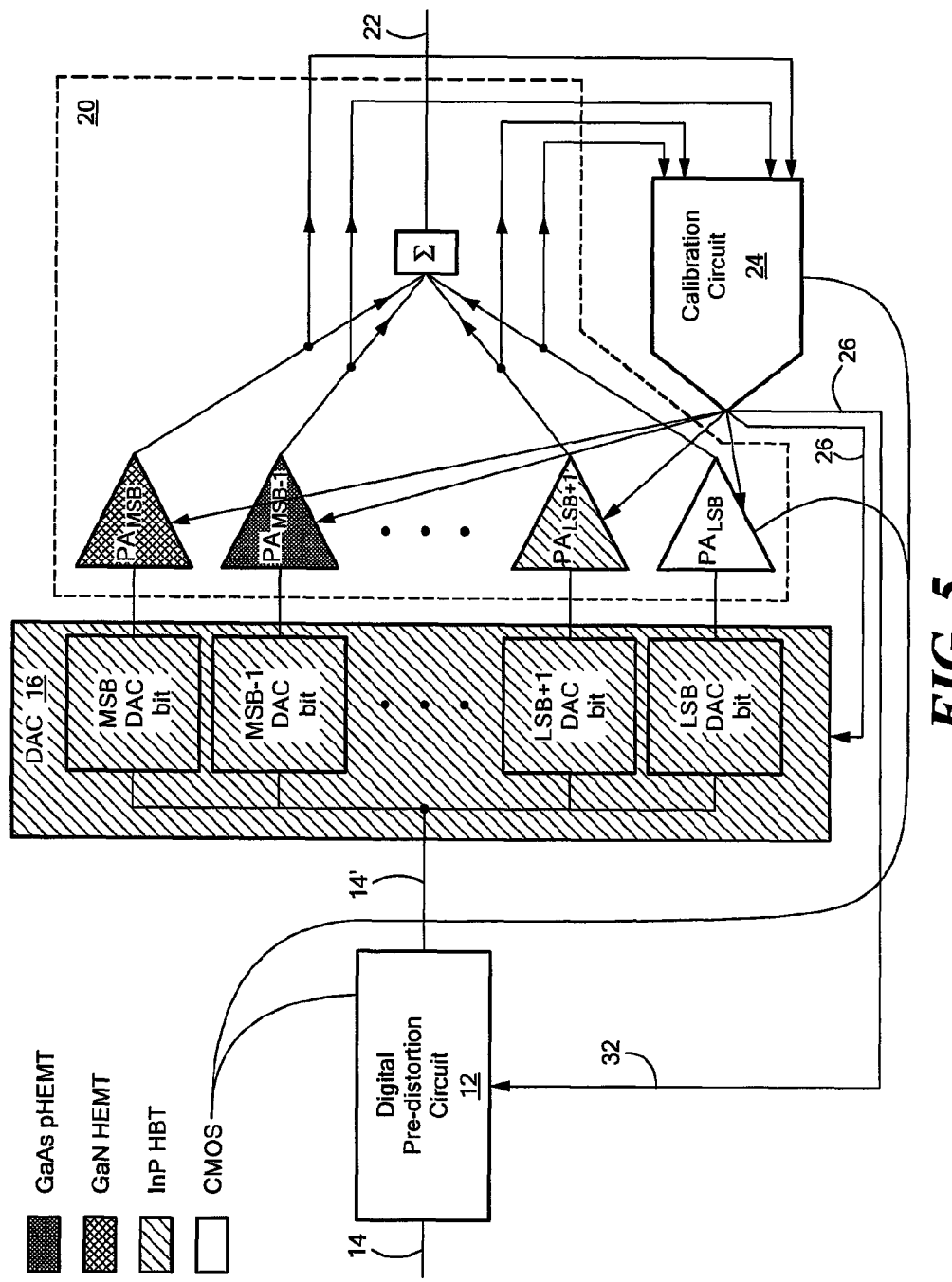
FIGS. 5 and 6 are diagrams showing various technologies used to fabricate the digital to analog core section, the power amplifier section and the calibration circuit of FIG. 4 and a pre-distortion circuit used in the in the digital analog circuit according to an embodiment of the invention.
Figure 6:
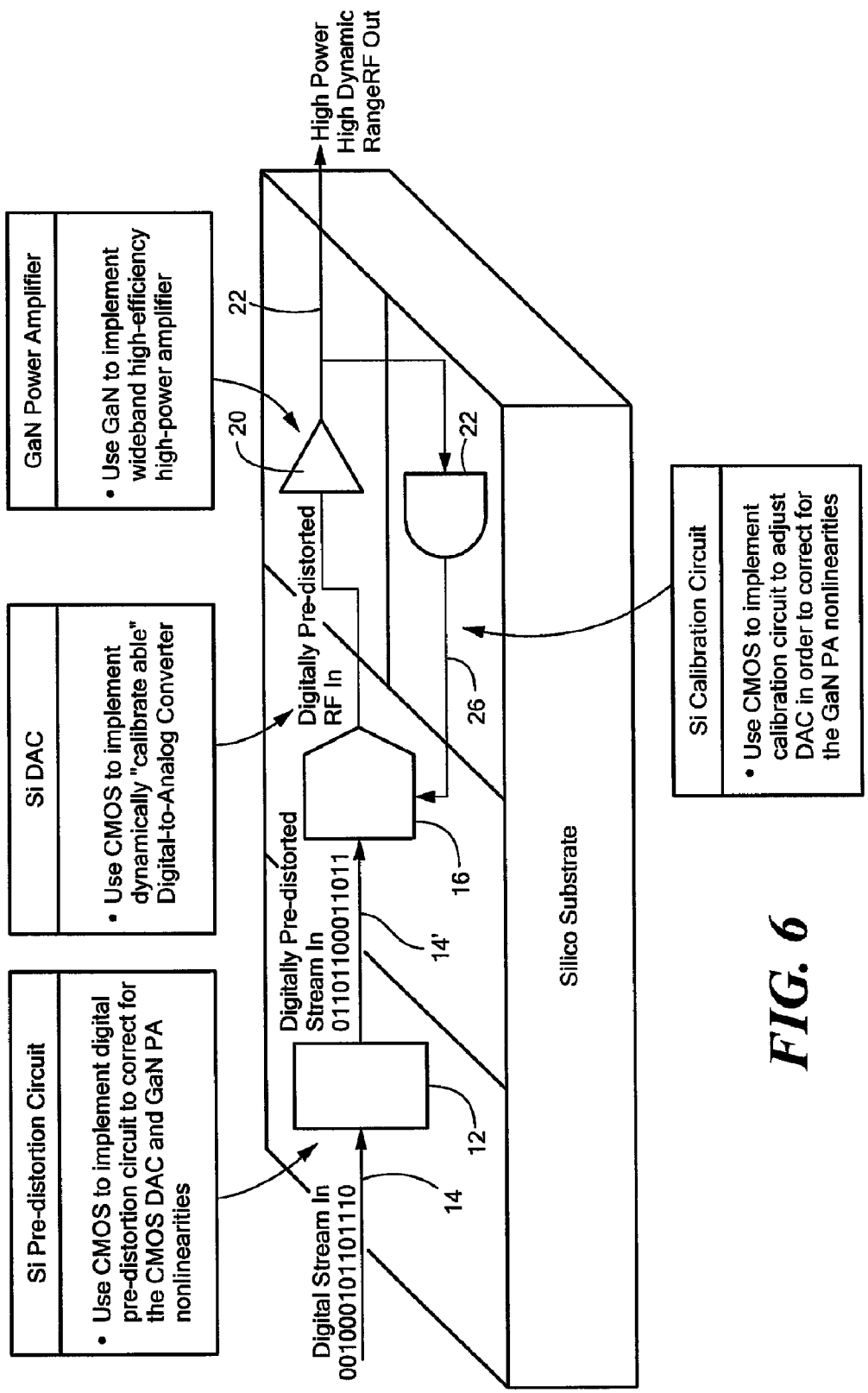

Referring now to FIGS. 5 and 6, all or parts of the configuration are heterogeneously integrated on a single chip with each of the components implemented in the most applicable semiconductor technology. For example, The DAC core section in silicon and the PAs in III-V.

For example, the digital pre-distortion circuit, DAC core section, LSB power amplifiers and the calibration circuit are implemented in low-power high-speed CMOS while MSB power amplifiers are implemented in a high-frequency high-power high-linearity III-V technology (for example, GaN HEMT or InP HBT or GaAs HBT or GaAs pHEMT). To maximize bandwidth and static dynamic range, the DAC core section is implemented in a bipolar technology with the highest switching speed (InP HBT). An enhancement in bandwidth, output power and dynamic range is realized by reducing the interconnect dimensions by virtue of having all or some parts of the configuration on a single chip.

A number of embodiments of the disclosure have been described. Nevertheless, it will be understood that various modifications may be made without departing from the spirit and scope of the disclosure. Accordingly, other embodiments are within the scope of the following claims.

What is claimed is:

1. A system, comprising:
a digital pre-distortion circuit fed by a digital signal for distorting the digital signal;
a digital to analog converter (DAC) core section for converting the distorted digital signal into a corresponding analog signal, the DAC core section performing the conversion in accordance with a control signal fed to the DAC core section;
a power amplifier (PA) section coupled to an output of the DAC core section for amplifying power in the analog signal;
a calibration circuit coupled to an output signal of the power amplifier section for producing, in response to the power in the power amplified analog signal, the control signal fed to the DAC core section; and
wherein the calibration circuit comprises a feedback calibration circuit for sensing a waveform of the PA section output signal and for comparing the sensed waveform with a pre-stored reference waveform to generate a digital error correction signal, such digital error correction signal being fed to an input to the DAC core section for adjusting bias settings in individual converter bits of the DAC core section and/or input of the power amplifier section and/or input of the digital pre-distortion circuit to compensate for the DAC core section and PA section nonlinearity.

2. The system recited in claim 1 wherein the pre-distortion circuit distorts the input signal as a function of expected distortion on the DAC section and the PA section to provide the output signal of the PA section with a predetermined level of dynamic range.

3. The circuit recited in claim 1 wherein the digital pre-distortion circuit at the input of DAC core section/PA section combination is arranged to correct for pre-determined non-linearities of both the DAC core section and the PA section.

4. The circuit recited in claim 1 wherein the calibration circuit provides a feedback circuit for sensing the waveform at the PA section output signal and for comparing the sensed waveform against a pre-stored reference waveform to generate a digital error correction signal for adjusting the DAC core section output to provide the output signal of the PA section with a predetermined level of dynamic range.

5. The circuit recited in claim 1 wherein the PA section includes a plurality of power amplifiers (PAs) at the output of the DAC core section.

6. The circuit recited in claim 5 wherein each DAC bit in the DAC core section is followed by a corresponding one of the plurality of power amplifiers (PAs).

7. The circuit recited in claim 6 wherein the outputs of DAC Least Significant Bits (LSB bits) are first combined with an R-2R ladder network within the DAC core section and then amplified by the corresponding coupled one of a first portion of the plurality of power amplifiers (PAs).

8. The circuit recited in claim 7 wherein the outputs of DAC Most Significant Bits (MSB bits) are first "linearly coded" and then amplified by a corresponding coupled one of a second portion of the plurality of power amplifiers (PAs).

9. The circuit recited in claim 8 wherein the outputs of at least one of the plurality of power amplifiers are sensed, collected and analyzed, and the control signals are generated by the feedback calibration circuit.

10. The circuit recited in claim 8 wherein the control signals are applied to adjust settings of the DAC core section and/or power amplifier section and/or digital pre-distortion circuit.

11. The circuit recited in claim 1 wherein the pre-distortion circuit, DAC core section, power amplifier (PA) section, and calibration circuit are integrated on a single integrated circuit chip to maximize circuit's performance in terms of bandwidth, dynamic range and output power by exercising enhanced control over the interfaces between major circuit blocks.

12. The circuit recited in claim 1 wherein the DAC core section, and power amplifier (PA) section are integrated on a single integrated circuit chip.

13. The circuit recited in claim 1 wherein the calibration produces, in response to the power amplified analog signal, signals to adjust the power amplifier section.

14. The circuit recited in claim 5 wherein the power amplifiers are adjustable power amplifiers.

15. The circuit recited in claim 6 wherein the power amplifiers are adjustable power amplifiers.

16. A system, comprising:
a digital to analog converter (DAC) core section a digital signal into a corresponding analog signal;
a power amplifier (PA) section coupled to an output of the DAC core section for amplifying power in the analog signal;
wherein the PA section includes a plurality of power amplifiers (PAs) at the output of the DAC core section and
wherein each DAC bit in the DAC core section is followed by a corresponding one of the plurality of adjustable power amplifiers (PAs)wherein the outputs of DAC Least Significant Bits (LSB bits) are first combined with an R-2R ladder network within the DAC core section and then amplified by the corresponding coupled one of a first portion of the plurality of power amplifiers (PAs).

17. The circuit recited in claim 16 wherein the outputs of DAC Most Significant Bits (MSB bits) are first "linearly coded" and then amplified by a corresponding coupled one of a second portion of the plurality of power amplifiers (PAs).

18. A system, comprising:
a digital to analog converter (DAC) core section a digital signal into a corresponding analog signal;
a power amplifier (PA) section coupled to an output of the DAC core section for amplifying power in the analog signal;
wherein the PA section includes a plurality of power amplifiers (PAs) at the output of the DAC core section and
wherein each DAC bit in the DAC core section is followed by a corresponding one of the plurality of adjustable power amplifiers (PAs)including a calibration circuit coupled to the output signal of the power amplifier section for producing, in response to the power amplified analog signal, control signals for the plurality of gain adjustable power amplifiers (PAs).

19. The circuit recited in claim 18 wherein the outputs of DAC Least Significant Bits (LSB bits) are first combined with an R-2R ladder network within the DAC core section and then amplified by the corresponding coupled one of a first portion of the plurality of power amplifiers (PAs).

* * * * *